United States Patent
Uchida et al.

(10) Patent No.: US 7,324,249 B2
(45) Date of Patent: Jan. 29, 2008

(54) RECORDING AND REPRODUCING APPARATUS HAVING FIXED DISTORTION CORRECTING FUNCTION

(75) Inventors: Akiyoshi Uchida, Kawasaki (JP); Toshikazu Kanaoka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 187 days.

(21) Appl. No.: 11/341,592

(22) Filed: Jan. 30, 2006

(65) Prior Publication Data
US 2007/0076281 A1    Apr. 5, 2007

(30) Foreign Application Priority Data
Oct. 3, 2005    (JP)    ............................... 2005-290406

(51) Int. Cl.
G03H 1/26    (2006.01)
G11B 7/00    (2006.01)
G11B 5/09    (2006.01)
G11B 15/52    (2006.01)
G11B 19/02    (2006.01)
G11B 20/00    (2006.01)

(52) U.S. Cl. ...................... 359/22; 369/47.17; 369/103
(58) Field of Classification Search ............. 359/1, 359/22, 32, 35; 369/30.22, 47.17, 53.35, 369/103, 106, 107
See application file for complete search history.

(56) References Cited

U.S. PATENT DOCUMENTS 7,031,038 B2 * 4/2006 Ogasawara et al. ............ 359/22
2006/0077852 A1 * 4/2006 Tateishi et al. ............. 369/103

FOREIGN PATENT DOCUMENTS

JP    2002-216359    8/2002
JP    2004-158114    6/2004

* cited by examiner

*Primary Examiner*—Alessandro Amari
(74) *Attorney, Agent, or Firm*—Staas & Halsey LLP

(57) ABSTRACT

A recording and reproducing apparatus includes a reproduction signal detection unit reproducing a two-dimensional pattern previously recorded on a holographic recording medium or user data recorded on the holographic recording medium, a reference pattern storage unit previously storing a reference pattern to be provided when the two-dimensional pattern is reproduced, a correction information generation unit comparing a reproduction reference pattern signal corresponding to the reproduced two-dimensional pattern with the stored reference pattern and removing fixed distortion contained in the reproduction reference pattern signal to generate correction information used for reproducing the reference pattern from the reproduction reference pattern signal, a correction information storage unit storing the correction information, and a distortion correction unit performing a correction calculation for a reproduction data signal using the correction information to generate corrected reproduction data from which the fixed distortion is removed.

6 Claims, 20 Drawing Sheets

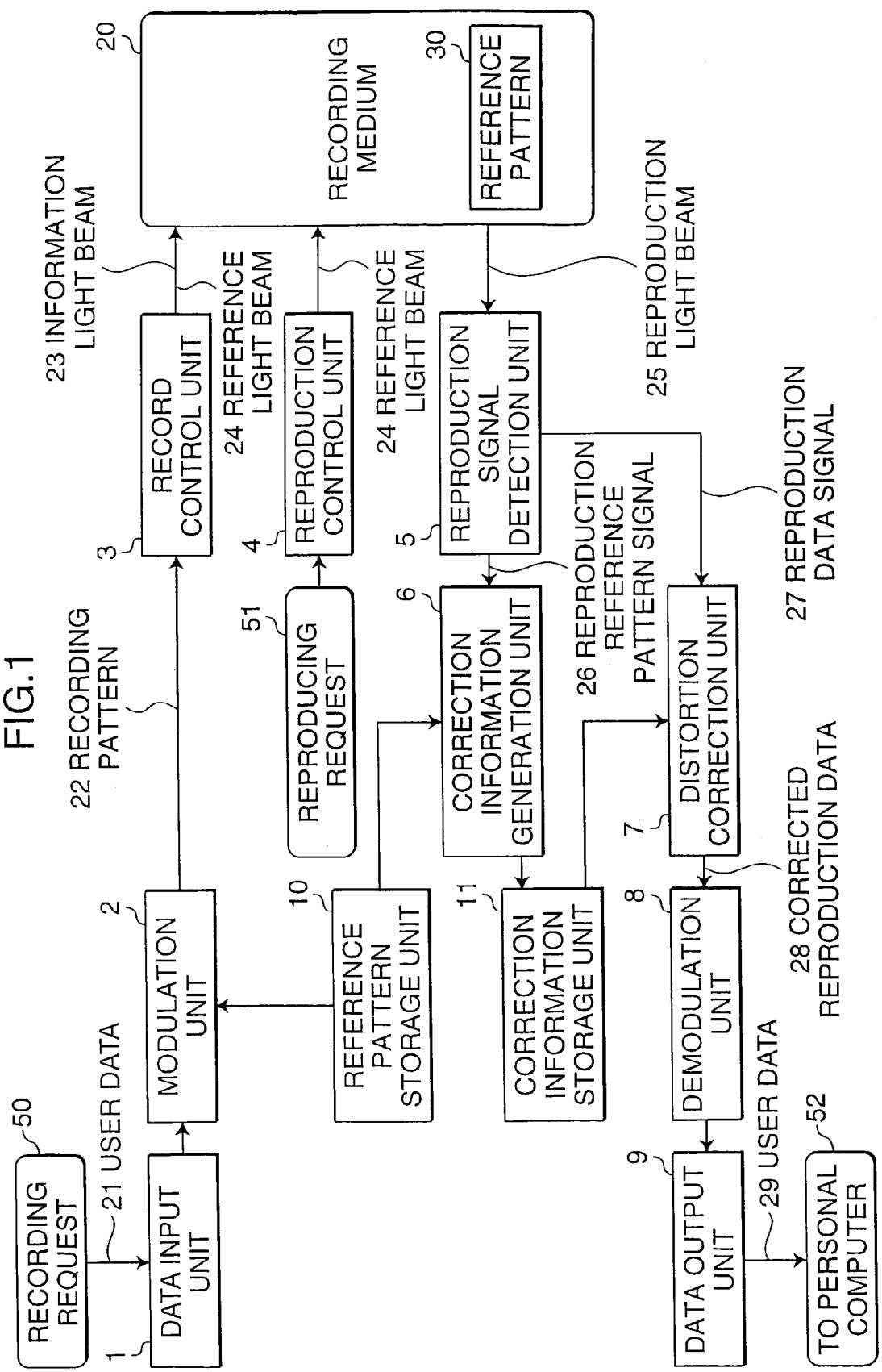

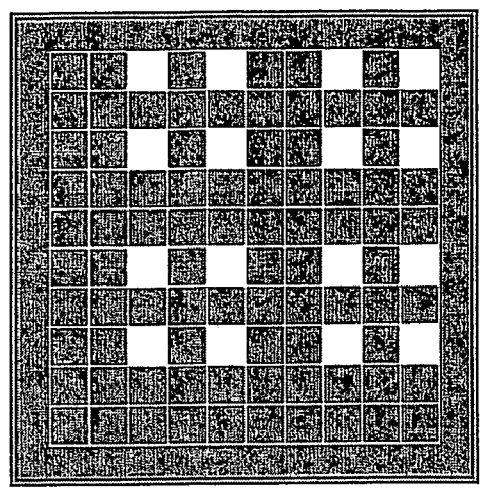
FIG. 2(c) Reference pattern 3
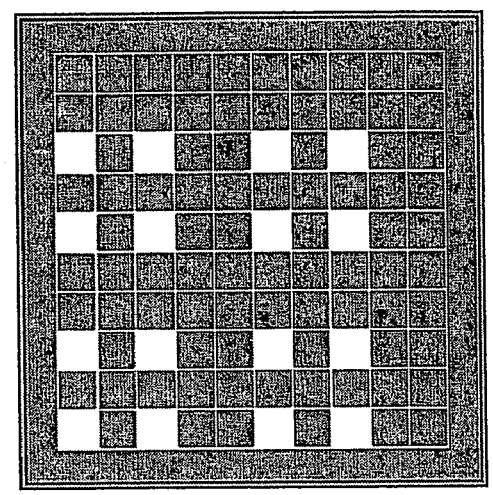
FIG. 2(b) Reference pattern 2
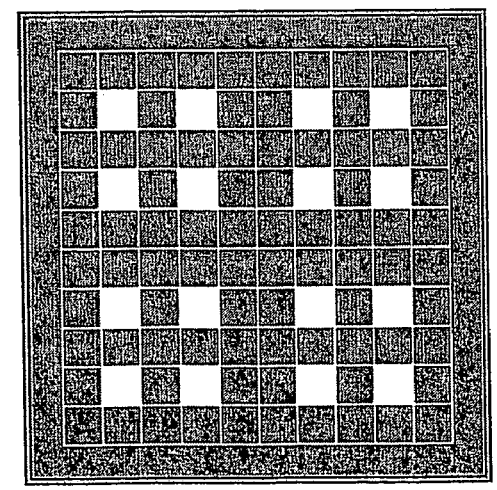
FIG. 2(a) Reference pattern 1

| 2.0 | 1.8 | 1.6 | 1.8 | 2.0 |
|---|---|---|---|---|
| 1.8 | 1.4 | 1.2 | 1.4 | 1.8 |
| 1.6 | 1.2 | 1.0 | 1.2 | 1.6 |
| 1.8 | 1.4 | 1.2 | 1.4 | 1.8 |
| 2.0 | 1.8 | 1.6 | 1.8 | 2.0 |
FIG. 3(c) Luminance correction coefficient
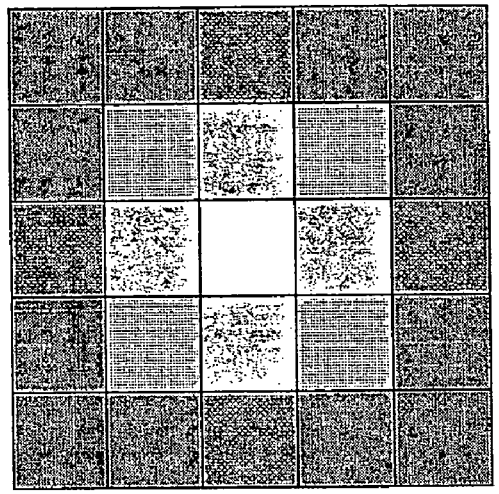
FIG. 3(b) Reproduction reference pattern signal
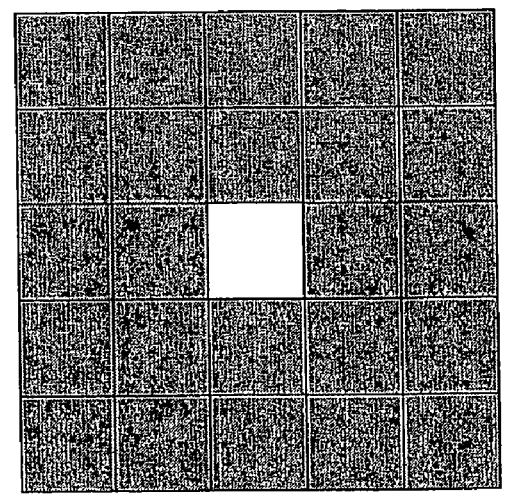
FIG. 3(a) Reference pattern to be standard

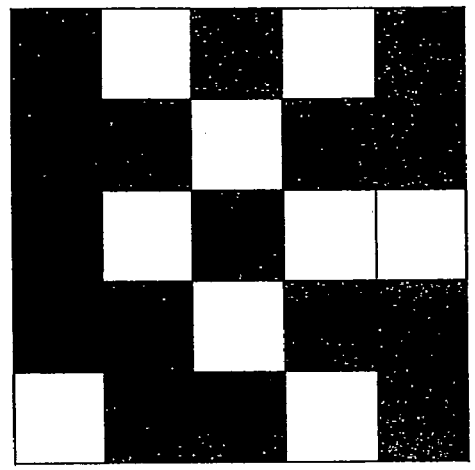
FIG. 4(b) Luminance correction coefficient
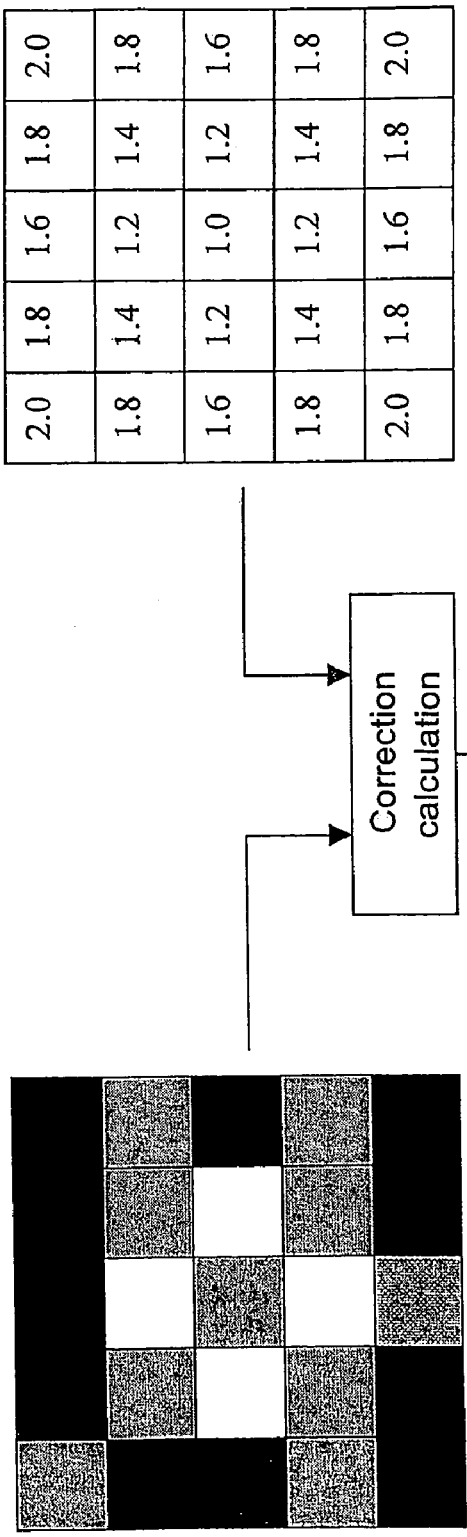
FIG. 4(a) Reproduction data signal
FIG. 4(c) Corrected reproduction data

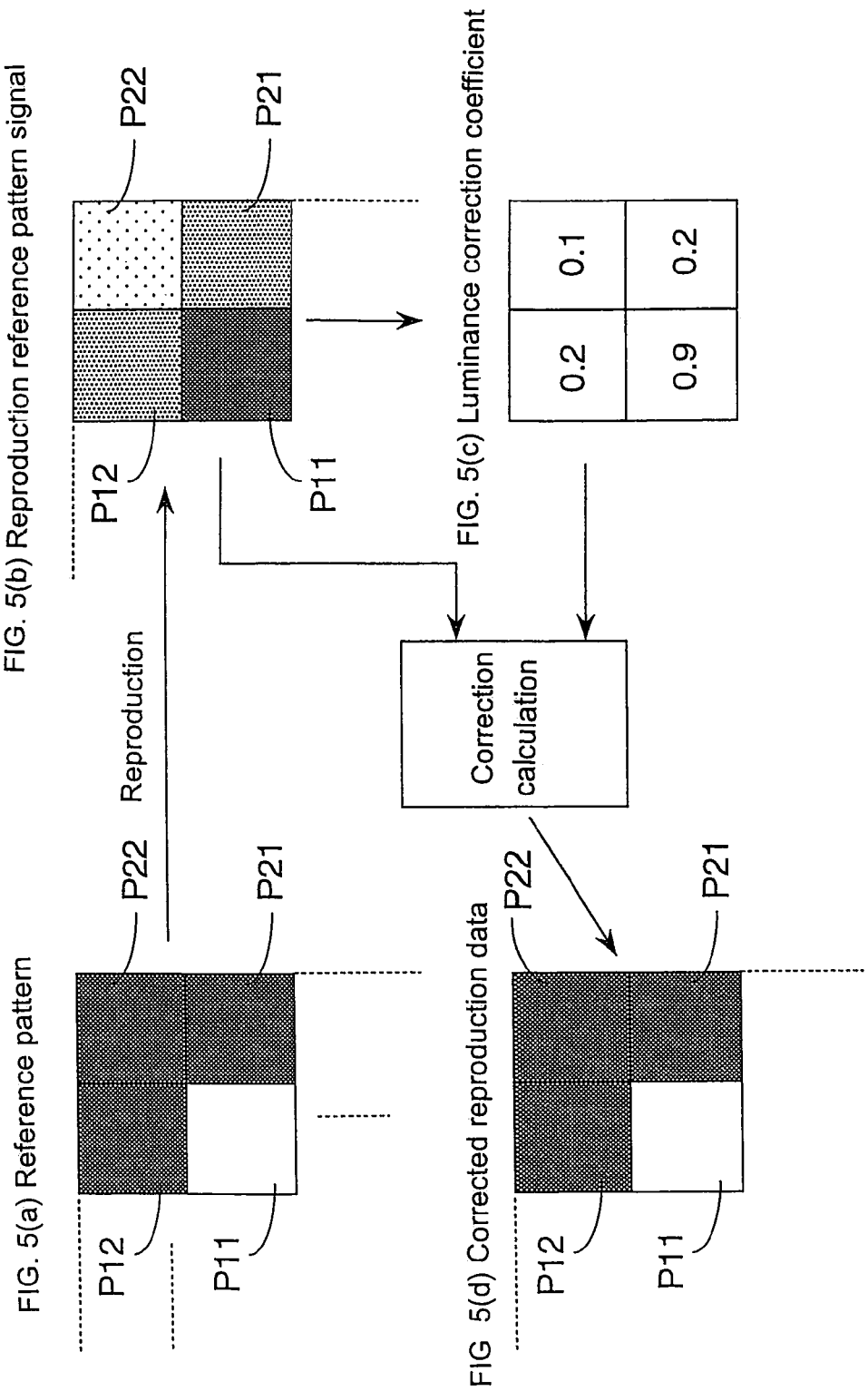

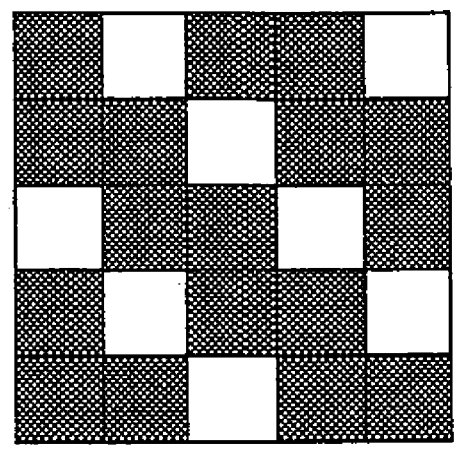
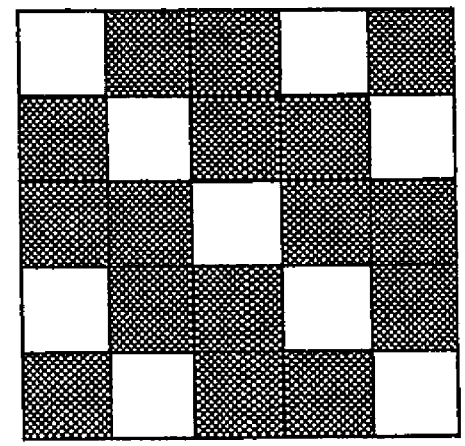
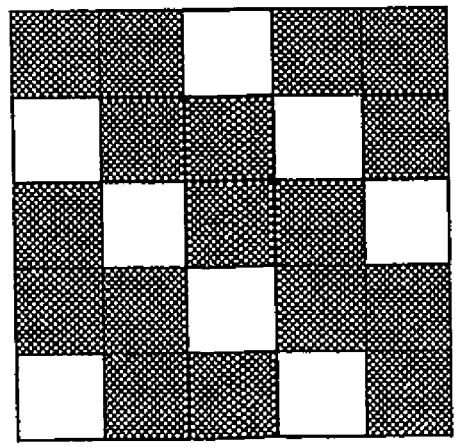
FIG. 7

FIG. 8(a) Rectangular aperture
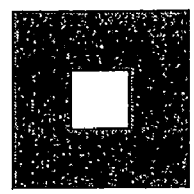
Diffracted image of rectangular aperture
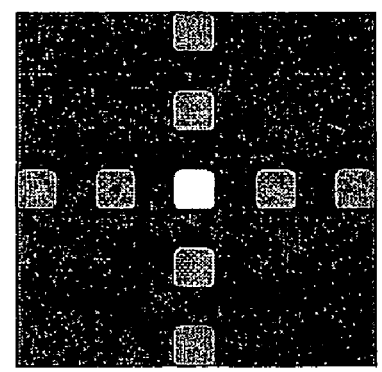
FIG. 8(b) Circular aperture
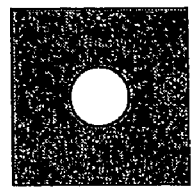
Diffracted image of circular aperture
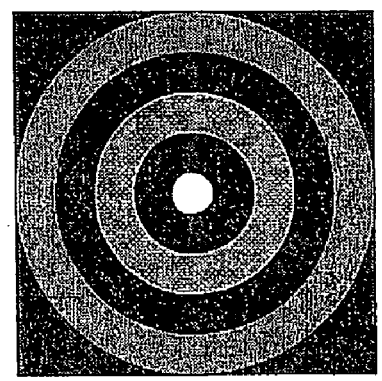

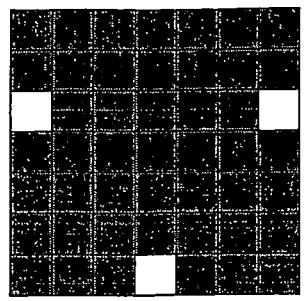
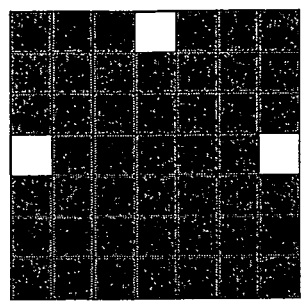
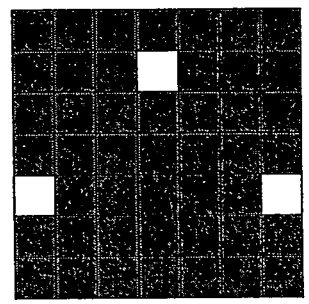
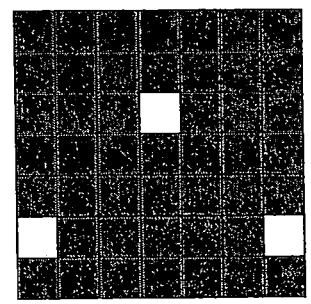
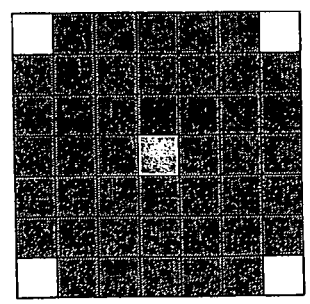
FIG. 9

FIG. 13
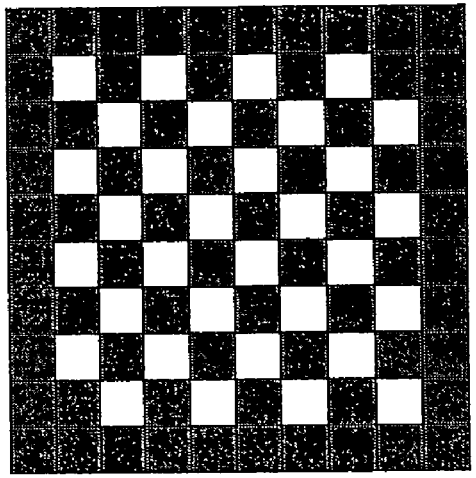
Reference pattern A
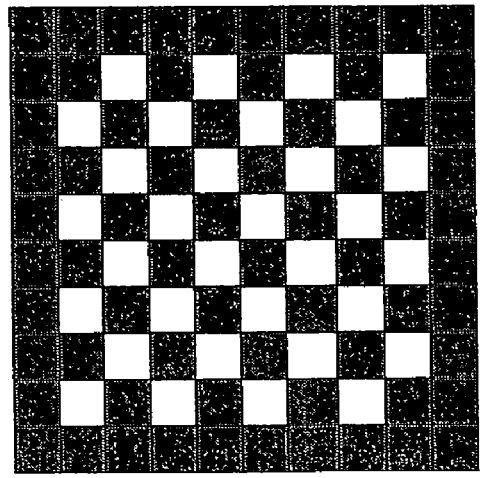
Reference pattern B

FIG. 14
Reproduction expectation value A
of reference pattern A
Reproduction expectation value B
of reference pattern B
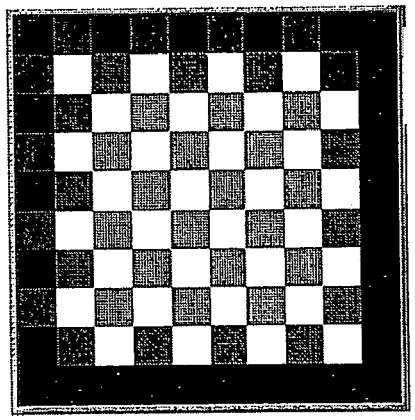
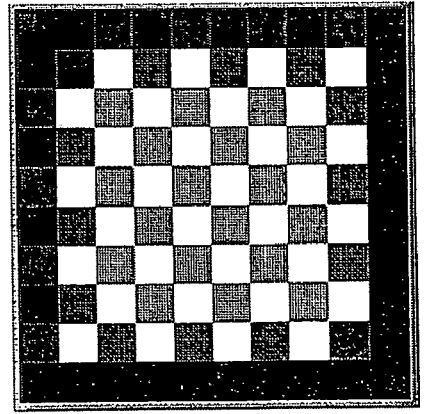

FIG. 15
Reproduction reference pattern signal A of reference pattern A
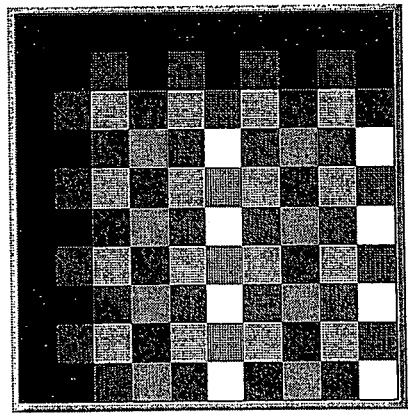
Reproduction reference pattern signal B of reference pattern B
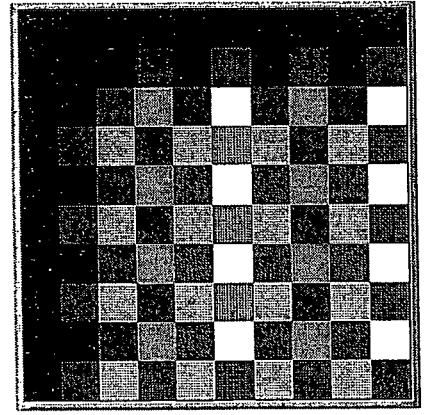

FIG. 16
Threshold value detection pattern A of reproduction reference pattern signal A
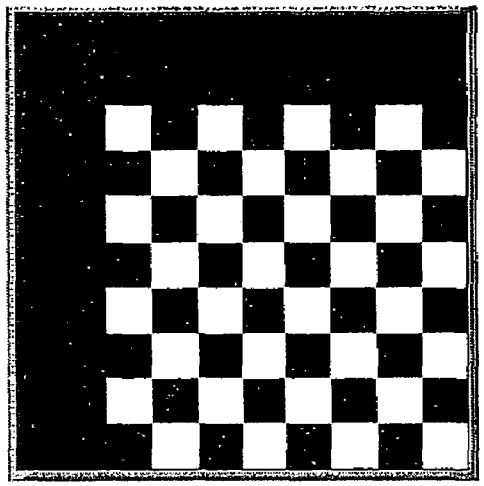
Threshold value detection pattern B of reproduction reference pattern signal B
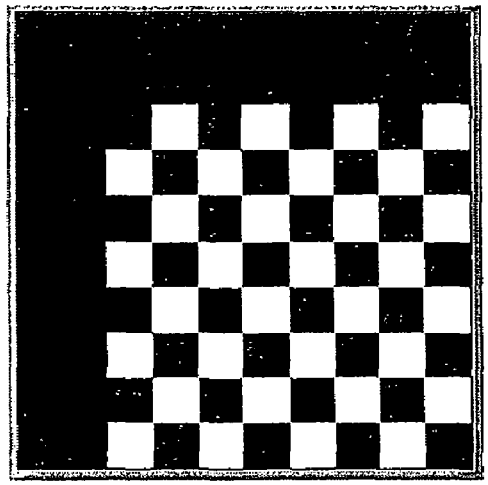

Position corrected data A

Position corrected data B

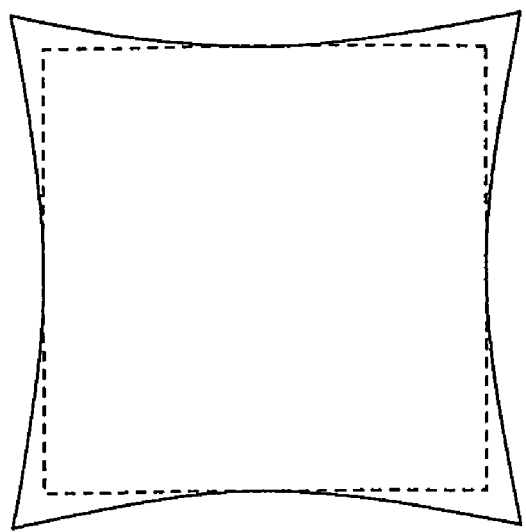
FIG. 19(a) Reel-shaped distortion
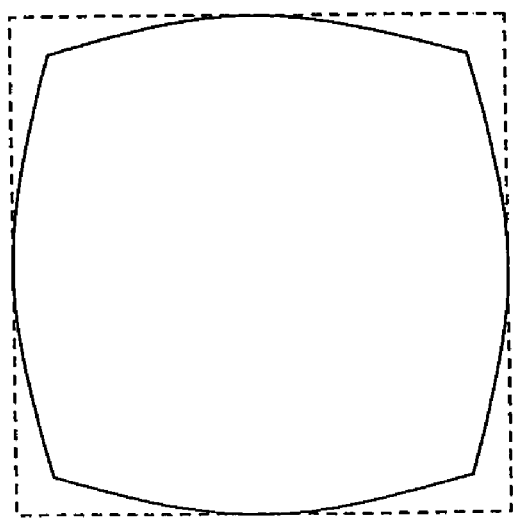
FIG. 19(b) Barrel-shaped distortion

RECORDING AND REPRODUCING APPARATUS HAVING FIXED DISTORTION CORRECTING FUNCTION

CROSS-REFERENCE TO RELATED APPLICATION

This application is related to Japanese patent application No.2005-290406 filed on Oct. 3, 2005, whose priority is claimed under 35 USC § 119, the disclosure of which is incorporated by reference in its entirety.

BACKGROUND OF THE INVENTION

1. Field of the Invention

The present invention relates to a recording and reproducing apparatus having a fixed distortion correcting function and more particularly, to an apparatus having a function to correct distortion specific to the recording and reproducing apparatus to record information by irradiating a holographic recording medium with an information light beam and a reference light beam at the same time.

2. Description of the Related Art

According to the holographic recording and reproducing apparatus, a predetermined position of a holographic material layer of a holographic recording medium is irradiated with an information light beam corresponding to two-dimensional page data and a reference light beam at the same time to record the two-dimensional page data.

The two-dimensional page data is recorded as an interference pattern of the two light beams (information light beam and reference light beam).

Meanwhile, the medium is irradiated with only the reference light beam and its reflected light beam (referred to as reproduction light beam also) is detected by a two-dimensional image sensor (CCD) and the page data recorded on the medium is reproduced.

As one of documents disclosing and reproducing apparatus, there are known Japanese Unexamined Patent Publication No. 2002-216359 and Japanese Unexamined Patent Publication No. 2004-158114.

Although the holographic recording and reproducing apparatus includes many optical components such as a light source to emit a laser beam, a lens group, a spatial light modulator (SLM), a mirror group, a two-dimensional image sensor (CCD) and the like, there is a manufacture error in each component in the apparatus.

Because of this error, fixed distortion specific to the apparatus is generated due to a difference in optical characteristics or a noise at the time of recording or reproducing.

Representative fixed distortion includes distortion aberration and a low-frequency noise.

For example, according to an objective lens provided in the vicinity of the medium, it is impossible to manufacture the same lens having ideal optical characteristics all the time, so that lens aberration exists in a product.

The lens aberration causes distortion aberration shown in FIG. 19 at the time of reproducing. This distortion aberration varies a position of a detection pixel of a reproduction signal.

FIG. 19(a) shows an example of a reel-shaped distortion and FIG. 19(b) shows an example of a barrel-shaped distortion.

Here, a rectangle shown by dotted line in FIG. 19 is an ideal two-dimensional image configuration detected by the two-dimensional image sensor (CCD) normally.

FIG. 19(a) shows a case in which a configuration of a detected image which should be a rectangle originally is drawn out and distorted due to aberration of a lens group including an objective lens.

FIG. 19(b) shows a case in which a configuration of a detected image which should be a rectangle originally is drawn in and distorted due to aberration of a lens group including an objective lens.

Although the central part of the CCD is hardly distorted and data is correctly reproduced, the data cannot be correctly reproduced toward the periphery (four corners especially) of the CCD in either case.

In addition, there is a case where a low-frequency noise is generated as shown in FIG. 20 due to sensitivity offset of the CCD or lens aberration.

The low-frequency noise means variation in luminance of the reproduction light beam detected on the CCD.

That is, a different luminance value is generated from each detection pixel at the time of reproducing.

For example, when it is assumed that all data which should be detected are the same data (1), although a reproduction light beam having the same luminance corresponding to the data (1) should be detected all pixels by the CCD, when there is lens aberration and the like, the light whose luminance should be determined as "1" could be detected as the light whose luminance is shifted to "0".

That is, even when it is determined that all data is the same correctly, the luminance detected in each pixel is varied actually in some cases. In addition, when the variation in luminance is large, the luminance which should be detected as "1" is detected as "0", which cause a reproduction error.

A correction method called "adaptive equalization" is proposed to correct the low-frequency noise shown in FIG. 20 so that data in which luminance is not varied can be reproduced.

The adaptive equalization is a method of removing the low-frequency noise by a kind of high-pass filter such as a FIR filter used in an optical disk and the like, in which a filtering coefficient is not fixed and needs to be updated as needed.

In addition, the adaptive equalization is performed when the user data is reproduced and its calculation amount is excessive, so that a circuit size to implement the adaptive equalization is large and it takes time for a correcting process.

According to a reproducing process of the holographic recording and reproducing apparatus, since the reproducing process is performed using the two-dimensional page data having great amount of data as a unit, when the adaptive equalization is used, it takes time for the correcting process, so that the reproducing process could not be performed in a practical time.

In addition, when such correcting process is implemented by hardware, a circuit size becomes large and a cost becomes high.

SUMMARY OF THE INVENTION

The present invention provides a recording and reproducing apparatus having a fixed distortion correcting function, including a reproduction signal detection unit reproducing either a two-dimensional pattern previously recorded on a holographic recording medium or user data recorded on the holographic recording medium; a reference pattern storage unit previously storing a reference pattern to be provided when the two-dimensional pattern is reproduced; a correction information generation unit comparing a reproduction reference pattern signal corresponding to the two-dimensional pattern reproduced by the reproduction signal detection unit with the reference pattern stored in the reference pattern storage unit, and removing fixed distortion contained in the reproduction reference pattern signal to generate correction information used for reproducing the reference pattern from the reproduction reference pattern signal; a correction information storage unit storing the generated correction information; and a distortion correction unit performing a correction calculation, for a reproduction data signal of the user data reproduced by the reproduction signal detection unit, using the stored correction information to generate corrected reproduction data from which the fixed distortion contained in the user data is removed.

Thus, since the two-dimensional pattern has been previously recorded on the holographic recording medium, the correction information to remove the fixed distortion specific to the recording and reproducing apparatus can be generated by reproducing the two-dimensional pattern.

BRIEF DESCRIPTION OF THE DRAWINGS

FIG. 1 is a block diagram showing a constitution of a recording and reproducing apparatus according to one embodiment of the present invention;

FIGS. 2(a), (b) and (c) are explanatory diagrams showing one embodiment of reference patterns according to the present invention;

FIGS. 3(a), (b) and (c) are explanatory diagrams showing a reference pattern and a luminance correction coefficient according to the present invention;

FIGS. 4(a), (b) and (c) are explanatory diagrams showing a generating process of corrected reproduction data according to the present invention;

FIGS. 5(a), (b), (c) and (d) are explanatory diagrams showing a correcting process of distortion aberration according to the present invention;

FIG. 7 is an explanatory diagram showing one embodiment of reference patterns according to the present invention;

FIGS. 8(a) and (b) are explanatory diagrams showing configurations of apertures and their diffracted images used in a recording and reproducing apparatus according to the present invention;

FIG. 9 is an explanatory diagram showing one embodiment of reference patterns in case of a circular aperture according to the present invention;

FIG. 13 is an explanatory diagram showing a concrete example of reference patterns used in one embodiment of the present invention;

FIG. 14 is an explanatory diagram showing one embodiment of patterns of reproduction expectation values according to the present invention;

FIG. 15 is an explanatory diagram showing one embodiment of reproduction reference pattern signals according to one embodiment of the present invention;

FIG. 16 is an explanatory diagram showing one embodiment of reproduction patterns after a reproduction data threshold detecting process according to the present invention;

FIGS. 19(a) and (b) are explanatory diagrams showing distortion aberration generated due to lens aberration.

DESCRIPTION OF THE PREFERRED EMBODIMENTS

Figure 6:
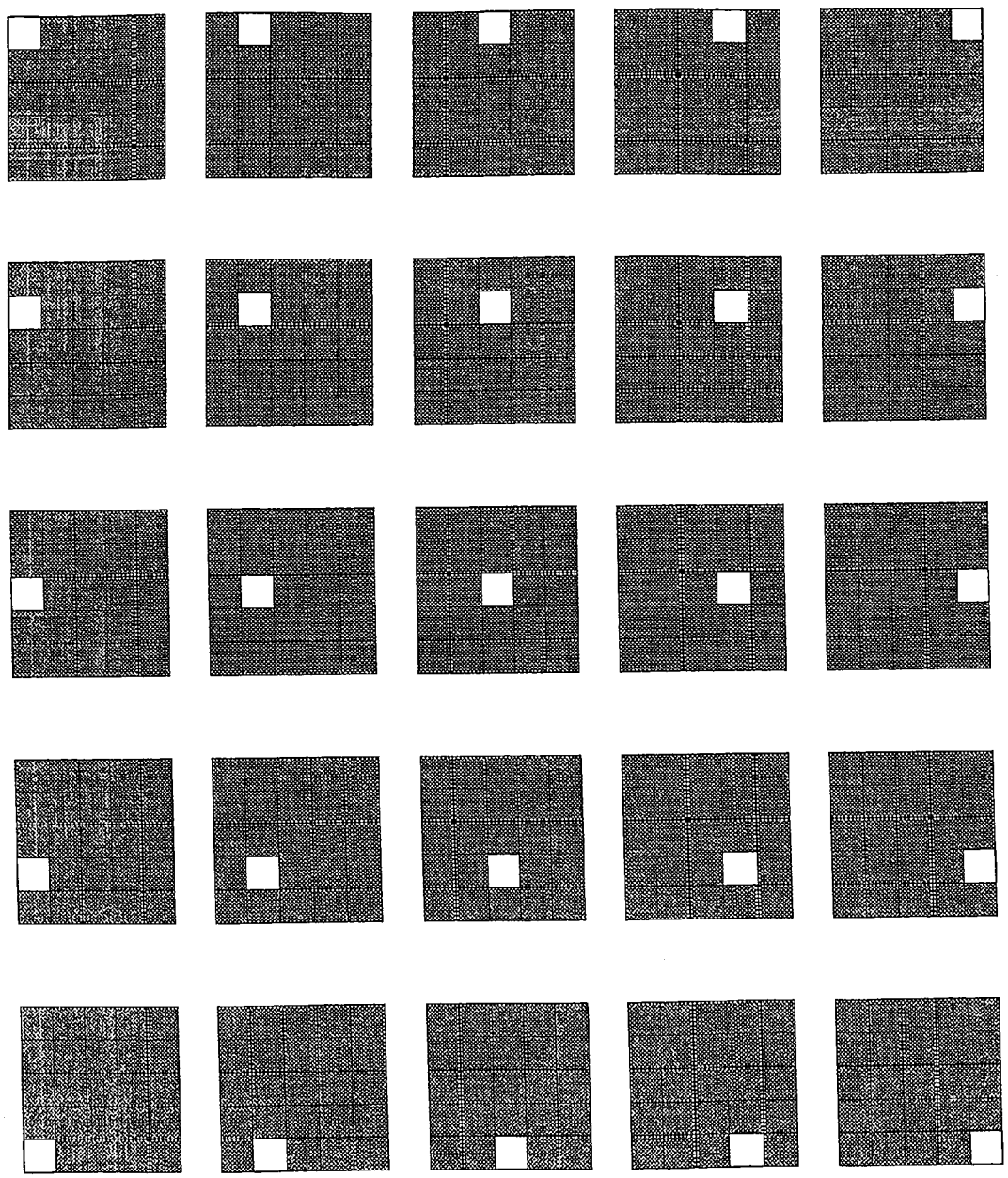
FIG. 6 is an explanatory diagram showing one embodiment of reference patterns according to the present invention.

The present invention is a recording and reproducing apparatus which is capable of holographic recording and reproducing, and has a fixed distortion correcting function in which fixed distortion specific to the apparatus such as distortion aberration or a low-frequency noise generated at the time of reproducing can be corrected to provide correct reproduction data from which the fixed distortion is removed.

The present invention provides a recording and reproducing apparatus having a fixed distortion correcting function, including a reproduction signal detection unit reproducing either a two-dimensional pattern previously recorded on a holographic recording medium or user data recorded on the holographic recording medium; a reference pattern storage unit previously storing a reference pattern to be provided when the two-dimensional pattern is reproduced; a correction information generation unit comparing a reproduction reference pattern signal corresponding to the two-dimensional pattern reproduced by the reproduction signal detection unit with the reference pattern stored in the reference pattern storage unit, and removing fixed distortion contained in the reproduction reference pattern signal to generate correction information used for reproducing the reference pattern from the reproduction reference pattern signal; a correction information storage unit storing the generated correction information; and a distortion correction unit performing a correction calculation, for a reproduction data signal of the user data reproduced by the reproduction signal detection unit, using the stored correction information to generate corrected reproduction data from which the fixed distortion contained in the user data is removed.

Further, the reference pattern includes luminance information in case the two-dimensional pattern is reproduced without any fixed distortion, the two-dimensional pattern previously stored on the holographic recording medium includes luminance information based on every detection unit pixel detected by the reproduction signal detection unit, and the luminance information is dispersed two-dimensionally so that a plurality of reproduction luminance signals of the detection unit pixels may not interfere with each other when the two-dimensional pattern is reproduced.

Thus, the number of the two-dimensional patterns recorded on the medium can be prevented from being increased and recording capacity for the user data to be recorded on the medium can be sufficiently ensured.

Here, when mutual interference of each detection unit pixel is negligible, the two-dimensional pattern previously recorded on the medium can be the same as the reference pattern recorded in the reference pattern storage unit. The following embodiments are described referring to the two-dimensional pattern recorded on the medium as a reference pattern 30.

Moreover, the correction information is a luminance correction coefficient to correct the fixed distortion specific to the recording and reproducing apparatus, and the fixed distortion includes distortion due to distortion aberration in which a position of a detection unit pixel detected by the reproduction signal detection unit is varied, and distortion due to a low-frequency noise in which a different luminance value is generated every detection unit pixel at the time of reproducing.

Thus, since the luminance correction coefficient to correct the two kinds of fixed distortions specific to the recording and reproducing apparatus is stored, both fixed distortions can be corrected in a short time by performing a correction calculation using this coefficient.

In addition, reproduction of the two-dimensional pattern by the reproduction signal detection unit and generation of the correction information by the correction information generation unit are performed at predetermined timing when reproduction of the user data by the reproduction signal detection unit is not performed, and the predetermined timing includes one or more timings among (i) just after the holographic recording medium is inserted, (ii) just after a predetermine temperature variation is generated in the recording and reproducing apparatus, (iii) after a lapse of predetermined days, and (iv) before shipment.

Thus, since the correction information is generated when the user data is not reproduced, a time for the reproducing process of the user data can be shortened as compared with the case distortion is considered each time the reproducing process of the user data is performed.

Moreover, the correction information generation unit calculates a difference between the luminance information of the reference pattern and the luminance information provided from the reproduction reference pattern signal of the two-dimensional pattern reproduced by the reproduction signal detection unit, every detection unit pixel, and a luminance correction coefficient provided as a result of the calculation is stored in the correction information storage unit as the correction information of the fixed distortion.

Thus, since it is not necessary to provide special hardware for generating the correction information, a circuit size to correct the fixed distortion and its cost can be reduced.

Further, the distortion correction unit performs a correction calculation to add the luminance information provided from the reproduction data signal of the user data reproduced by the reproduction signal detection unit, to the luminance correction coefficient recorded in the correction information storage unit, every detection unit pixel, and corrected reproduction data for the user data is generated.

Thus, since the correction calculation is the simple addition, it is not necessary to provide hardware especially for the correction calculation, so that a circuit size and its cost can be reduced and distortion correction can be performed at high speed.

An embodiment of the present invention will be described with reference to the drawings hereinafter. In addition, the present invention is not limited to the following embodiment.

<Constitution of Recording and Reproducing Apparatus According to the Present Invention>

FIG. 1 is a block diagram showing a constitution of a recording and reproducing apparatus according to one embodiment of the present invention.

According to the present invention, a recording medium 20 for recording and reproducing is a holographic recording medium.

The holographic recording medium 20 is a medium such that a holographic material layer having a thickness of about 2 mm is formed on a glass substrate through a reflection layer. The holographic material layer is irradiated with an information light beam and a reference light beam emitted from the same light source at the same time so that an interference pattern is formed in the holographic material layer with the two light beams and information is recorded using this interference pattern.

According to the block diagram in FIG. 1, functional blocks of the recording and reproducing apparatus are shown, and a part related to a distortion correcting function is mainly shown. Each functional block is implemented by an optical component such as a lens, a light source, a light receiving element, an actuator to control the movement of the lens and the like, or hardware of a microcomputer to modulate or demodulate user data and the like.

Especially, the functional blocks such as a modulation unit, a demodulation unit, a correction information generation unit and distortion correction unit are implemented by collaboration of a microcomputer including a CPU, a ROM, a RAM, an I/O controller and a timer, and a control program stored in the ROM and the like.

A data input unit 1, a modulation unit 2 and the record control unit 3 are related to a data recording process mainly, and the other functional blocks are related to a data reproducing process.

In addition, a reproduction control unit 4, a reproduction signal detector 5, a demodulation unit 8, and a data output unit 9 are related to general reproducing process in which distortion is not corrected, and a correction information generation unit 6, a distortion correction unit 7, a reference pattern storage unit 10, and a correction information storage unit 11 are related to distortion correcting process which is unique to the present invention.

Referring to FIG. 1, the data input unit 1 receives a recording request 50, a user data 21 to be recorded and a record address from a higher-level device such as a personal computer.

The modulation unit 2 encodes the received user data 21 and adds an error correction code according to need to convert the user data to a recording pattern 22 in a form which can be applied to a spatial light modulator (SLM) (not shown).

The record control unit 3 applies the converted user data to the spatial light modulator (SLM) and controls positions of the light source, the lens, the mirror and the like so that a light beam is emitted from the light source, and the medium 20 is irradiated with an information light beam 23 and a reference light beam 24.

The reproduction control unit 4 finds a physical address on the medium in which reproducing is performed based on a reproducing request 51 from the higher-level device, and controls positions of the light source, the lens, the mirror and the like so that only the reference light beam 24 is emitted from the light source and the medium 20 is irradiated with the reference light beam 24.

When the medium 20 is irradiated with the reference light beam 24, a reproduction light beam 25 corresponding to a holographic pattern recorded in the irradiated position is generated.

The reproduction signal detector 5 includes a two-dimensional image sensor (CCD) and receives the reproduction light beam 25 from the recording medium 20 in the two-dimensional image sensor (CCD) and generates an electric reproduction signal (26 or 27) corresponding to the reproduction light beam 25.

According to the present invention, there are two kinds of reproduction signals, in which one is a reproduction reference pattern signal 26 which reproduced a reference pattern 30 and the other is a reproduction data signal 27 which reproduced the normal user data.

The reference pattern 30 is a well-known pattern to generate the correction information, which is a two-dimensional pattern as shown in FIG. 2.

Each of three reference patterns shown in FIG. 2 includes 100 pixels in a matrix of 10×10, in which there are 16 white pixels and 84 black pixels, for example. Positions of the white pixels are different in the three reference patterns. Referring to FIG. 2, one pixel is a unit which is detected by the CCD, and this two-dimensional pattern includes luminance information of the detection unit pixels.

Such reference pattern 30 is previously written on the medium 20 by a master recording apparatus before shipment. In addition, it is previously stored in the reference pattern storage unit 10 of the recording and reproducing apparatus.

In addition, other than the two-dimensional pattern which is the same as that written on the medium 20 previously, a pattern (expectation value) to be provided when the two-dimensional pattern is reproduced may be stored in the reference pattern storage unit 10.

The correction information generation unit 6 generates the correction information from the reproduction reference pattern signal 26 by a distortion correcting process as will be described below. The generated correction information is stored in the correction information storage unit 11.

The correction information means a luminance correction coefficient by which fixed distortion specific to the recording and reproducing apparatus is corrected. For example, it is used to correct a reproduction data signal 27 containing the distortion outlined by a solid line shown in FIG. 19 to be a normal rectangular reproduction data signal 27 outlined by a dotted line.

Figure 20:
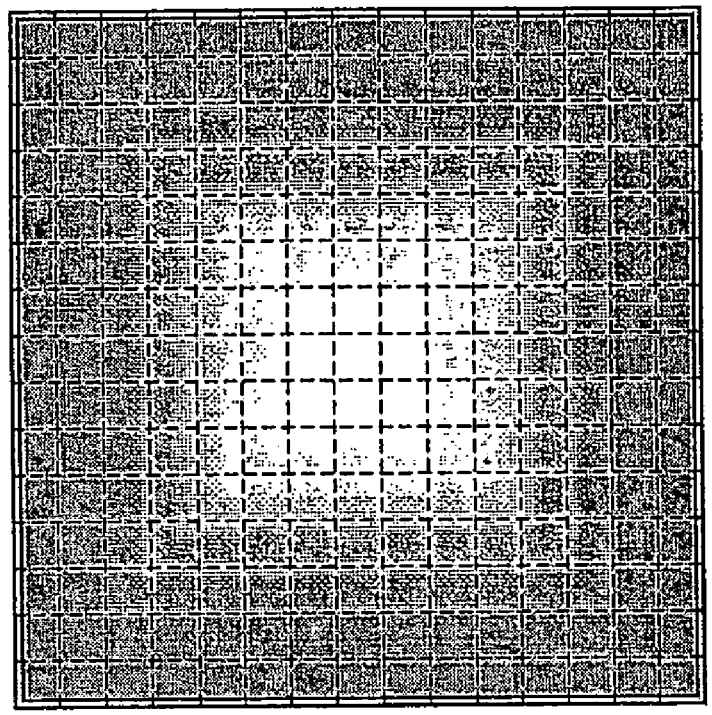
FIG. 20 is an explanatory diagram showing a detection pattern of a low-frequency noise.

In addition, as shown in FIG. 20, a reproduction data signal 27 in which luminance is varied due to a low-frequency noise is corrected to be a normal reproduction data signal 27 having uniform luminance using the correction information.

For example, the correction information is information (luminance correction coefficients) shown in FIG. 3(c).

FIG. 3(c) shows correction information for two-dimensional pattern including 25 pixels in a matrix of 5×5, and a numeral in each pixel is a luminance correction coefficient of that pixel. For example, a luminance correction coefficient of an upper left pixel is 2.0. A predetermined correction calculation is performed for a luminance value of the upper left pixel of the reproduction data signal 27 actually provided in the CCD, using the luminance correction coefficient of 2.0, so that the luminance value of the upper left pixel can be corrected. This correction is performed by the distortion correction unit 7.

The distortion correction unit 7 removes the fixed distortion in the reproduction data signal 27 provided when the user data recorded in the medium 20 is reproduced, using the correction information stored in the correction information storage unit 11 (luminance correction coefficient shown in FIG. 3(c), for example) and generates a corrected reproduction data 28.

The demodulation unit 8 performs an error correction decoding process for the corrected reproduction data 28 and the like to demodulate it to original user data 29.

The data output unit 9 transfers the user data 29 which was read out from the medium 20 and corrected in distortion, to the higher-level device 52 such as the personal computer.

Since the recording and reproducing apparatus according to the present invention includes many optical components, an apparatus which is perfectly the same without an error in physical arrangement of a lens and the like cannot be manufactured all the time, so that the fixed distortion shown in FIGS. 19 and 20 are different depending on an apparatus and it is specific to the apparatus.

Thus, it is preferable that the correction information generation unit 6 generates the correction information and stores it in the correction information storage unit 11 before the user data is recorded or reproduced actually.

Thus, when the user data is reproduced actually, the distortion correction unit 7 converts the reproduction data signal 27 to the corrected reproduction signal 28 using the correction information stored in the correction information storage unit 11.

<Schematic Explanation of Distortion Correcting Process>

FIG. 3 is an explanatory diagram showing one embodiment of the reference pattern and its reproduction reference pattern signal.

FIG. 3(a) shows a reference pattern (two-dimensional pattern) 30 which has been previously stored on the medium 20 and becomes a criterion to generate the correction information.

The reference pattern includes 25 pixels in 5×5 matrix, in which only a central pixel is white and others are black.

When it is assumed that the recording and reproducing apparatus is a perfect apparatus without any fixed distortion, when the reference pattern 30 in FIG. 3(a) is reproduced, the reproduction reference pattern 26 has the same pattern as that in FIG. 3(a).

However, since the central pixel affects the 8 pixels around it due to light diffraction phenomenon and the like actually, the luminance of the reproduction signal is varied. For example, the pixel which is originally black could be reproduced as a pixel having a luminance which is shifted from black to white.

The diffraction phenomenon affects not only the 8 pixels around the white pixel but also 16 pixels around the 8 pixels and the 16 pixels could be reproduced as pixels having luminance which is slightly shifted from black to white.

FIG. 3(b) shows an embodiment of the reproduction reference pattern 26 in which luminance of the pixels is varied due to such diffraction phenomenon when the reference pattern in FIG. 3(a) is reproduced.

Referring to FIG. 3(b), although the central pixel is white, other pixels which should be black are gray having luminance higher than that of black.

Although FIG. 3 is provided for explanation and the luminance is not always varied in each pixel, the luminance could be varied in some pixels as shown in FIG. 20.

FIG. 3(c) is an embodiment of the luminance correction coefficients corresponding to the correction information recorded in the correction information storage unit 11.

Using the coefficients shown in FIG. 3(c), the reproduction reference pattern signal 26 shown in FIG. 3(b) is converted to the original reference pattern shown in FIG. 3(a).

In addition, although the luminance correction coefficients correspond to 25 pixels, those are used so that the central white pixel may have the same luminance as that in the reference pattern in FIG. 3(a).

In order words, a correction calculation is performed for each of the 25 pixels of the reproduction reference pattern 26 shown in FIG. 3(b) using each coefficient shown in FIG. 3(c) to find the original luminance of the central pixel in FIG. 3(a).

Therefore, the luminance correction coefficients shown in FIG. 3(c) are related to the central white pixel and there are luminance correction coefficients for the other 24 pixels to return them to the luminance of the pixels shown in FIG. 3(a).

That is, when 25 pixels exist, there are 25 luminance correction coefficients shown in FIG. 3(c) and it is recorded in the correction information storage unit 11 as a coefficient map including 25 coefficients for each pixel.

The luminance correction coefficient is generated in the correction information generation unit 6 using the reproduction reference pattern signal 26 shown in FIG. 3(b) in a method as will be described below.

FIG. 4 is a schematic explanatory diagram showing the correction calculation performed in the distortion correction unit 7.

FIG. 4(a) shows an embodiment of the reproduction data signal 27 which is provided by reproducing the user data stored on the medium 20.

Here, although 25 pixels are white or black originally, some of them are gray as a middle color because of the above-described diffraction phenomenon.

FIG. 4(b) shows the luminance correction coefficients shown in FIG. 3(c), and this coefficient map is stored in the correction information storage unit 11 for 25 pixels.

The distortion correction unit 7 performs a predetermined correction calculation for each pixel of the reproduction data signal shown in FIG. 4(a) using the coefficient shown in FIG. 4(b) and generates corrected reproduction data 28 for each pixel. FIG. 4(c) shows the corrected reproduction data 28 provided by the correction calculations.

Referring to FIG. 4(c), the gray pixels are corrected to be original white or black pixels.

Thus, the varied luminance shown in FIG. 20 is corrected by such correcting process, so that reproduction data 28 coincides with the original user data having no low-frequency noise.

Here, since the concrete correction calculating formula depends on a method of determining the coefficient, it is difficult to determine it uniquely.

According to one recording and reproducing apparatus, when it is assumed that the reproduction reference pattern signal 26 shown in FIG. 3(b) is surely provided from the reference pattern shown in FIG. 3(a), a calculation formula to convert the luminance of each pixel in FIG. 3(a) to the luminance in FIG. 3(b) can be uniquely specified. Therefore, on the contrary, a calculation formula of an inverse calculation and a parameter to return the reproduced luminance of each pixel shown in FIG. 3(b) to the original luminance shown in FIG. 3(a) can be specified.

It can be considered that the data corresponding to this parameter is the luminance correction coefficient shown in FIG. 3(c), and the formula of the inverse calculation is the formula to be carried out in the correction calculation shown in FIG. 4.

The above description has been mainly made of the case that the luminance is varied as shown in FIG. 20.

Next, a description will be made of a correcting process when distortion aberration is generated as shown in FIG. 19.

In the case of the distortion aberration, since a detected pixel position is shifted outward or inward as shown in FIG. 19, it is necessary to return a detection position of distorted pixel data to its original position.

In this case, it is not necessary to provide a special process to correct the position, the detection position can be corrected by performing the same process as the inverse calculation using the luminance correction coefficient described with reference to FIGS. 3 and 4.

FIG. 5 is a schematic explanatory diagram showing a correcting process for displacement of the distortion aberration.

FIG. 5(a) shows only an upper right in the reference pattern 30 shown in FIG. 3(a)

Here, it is assumed that only a pixel P11 is a white pixel and others are all black pixels.

When the reference pattern 30 shown in FIG. 5(a) is reproduced in a certain apparatus, it is assumed that the reproduction reference pattern signal 26 shown in FIG. 5(b) is provided.

Here, it is assumed that distortion in which the pixels are elongated in an upper right direction is provided as shown in FIG. 19(a).

Referring to FIG. 5(b), it is assumed that data having luminance of almost white is reproduced in a pixel P22 due to such distortion aberration and data having luminance almost black is reproduced in a pixel P11 which was originally white.

According to the reference pattern in FIG. 5(a), since only the pixel P11 is white, it is considered that the luminance data almost white in the pixel P22 in the reproduction pattern signal 26 in FIG. 5(b) is shifted from the pixel P11 of the pattern signal 26.

Thus, a luminance correction coefficient to generate the reference pattern in FIG. 5(a) from the reproduction pattern signal 26 in FIG. 5(b) is generated.

FIG. 5(c) shows an example of the coefficients.

The number of the luminance correction coefficients is the same as that of the pixels like in FIG. 3.

When the luminance correction coefficient shown in FIG. 5(c) is applied to the reproduction reference pattern signal 26 in FIG. 5(b) and its correction calculation is performed according to a predetermined formula, corrected reproduction data 28 shown in FIG. 5(d) can be generated.

Thus, the corrected reproduction data 28 can be the same as that in FIG. 5(a).

That is, even when the reproduced position of the pixel is shifted due to the distortion aberration as shown in FIG. 19, the reproduction data can be corrected in the same idea applied to the correcting process of the low-frequency noise in FIG. 20.

<Embodiment of Reference Pattern>

Next, an embodiment of the reference pattern (two-dimensional pattern) to be previously recorded on the medium 20 will be described.

When it is assumed that performance or operation circumstances of the optical component and the like is not changed at the time of reproducing, in case that the recording medium 20 is a movable medium, it is considered that even when the medium is exchanged, tendency to generate distortion shown in FIG. 19 or 20 is almost the same at the time of reproducing in the same recording and reproducing apparatus.

Therefore, a degree of fixed distortion generated in the pixel position of the two-dimensional image sensor (CCD) can be almost the same at the time of reproducing. That is, the coefficient to correct the distortion can be uniquely specified for each pixel.

In addition, since luminance of one pixel at the time of reproducing affects (interferes) pixels around that pixel due to the diffraction phenomenon of the reproduction light, it is necessary to form the reference pattern so that the diffraction phenomenon may not affect other adjacent pixels.

For example, when it is assumed that a reproduction light of one pixel P surely affects 8 pixels adjacent to the pixel P, a reference pattern which reproduce the data of the pixel P and the pixels adjacent to the pixel P at the same time cannot be employed.

Thus, in order to reproduce luminance correction coefficients for all of the pixels in the CCD, reference pattern group shown in FIG. 6 is considered as one embodiment.

FIG. 6 shows reference patterns when the CCD includes 25 pixels of 5×5 matrix.

According to the 25 reference patterns shown in FIG. 6, each reference pattern has one white pixel and others are black pixels and the position of the white pixel is different in the patterns.

All of the 25 reference patterns are previously stored on the medium 20 and the reference patterns are sequentially reproduced. Thus, respective reproduction reference pattern signals 26 are detected and luminance correction coefficients are calculated such that the detected 25 reproduce reference pattern signals 26 can be corrected to be the 25 reference patterns in FIG. 6.

Thus, a luminance correction coefficient having no mutual interference can be provided every pixel.

Although the case the CCD includes 25 pixels by 5×5 has been described in the embodiment of the reference pattern shown in FIG. 6, the number of pixels of the CCD is considerably great in the apparatus in practical use.

When the number of pixels is about 25, since the number of reference patterns to be previously recorded on the medium 20 is 25, recording capacity required for the reference pattern is small and it can be considered that the recording capacity of the user data can be ensured on the medium.

However, in case that the number of pixels of the CCD comes to a level of 100×100 matrix or 1000×1000 matrix, when the reference patterns are formed in the same way of thinking shown in FIG. 6, the number of reference patterns to be recorded on the medium becomes ten thousand or one million, and the recording capacity to used for the reference patterns becomes enormous, so that the recording capacity for the user data is reduced.

Therefore, when the number of the pixels of the CCD is great, it is not preferable to employ the reference pattern group shown in FIG. 6. Thus, it is necessary to think of reducing the number of reference patterns to be recorded.

FIG. 7 shows another embodiment of the reference pattern group according to the present invention.

According to the reference pattern group shown in FIG. 7, like in FIG. 6, a CCD includes 25 pixels in 5×5 matrix. According to the three reference patterns, the positions of the white pixels are different.

In addition, although an aperture having a fine opening in general is provided in front of the objective lens arranged in the vicinity of the medium 20 to reduced an influence of the aberration of the lens, this aperture is in the form of a rectangle (square, for example) in the reference pattern shown in FIG. 7.

In the case of the rectangular aperture (refer to FIG. 8(a)), by only forming the three reference patterns as shown in FIG. 7 and recording them on the medium, luminance correction coefficients in which interference with the pixels is negligible can be generated like in FIG. 6.

The reason why only the three reference patterns are enough will be described.

FIG. 8 is an explanatory diagram showing a relation between a configuration of the aperture and a diffracted image detected by the CCD at the time of reproducing.

FIG. 8(a) shows a configuration of a rectangular aperture and its diffracted image, and FIG. 8(b) shows a configuration of a circular aperture and its diffracted image.

According to FIG. 8(a), in case that the aperture is a square (rectangle), diffracted images are detected at intervals toward respective four sides other than a central transmission image.

There is no diffracted image generated toward four corners of the square (that is, in a diagonal direction).

Thus, since diffracted image could overlap with each other at the time of reproducing among pixels positioned in a horizontal or vertical direction, the reproduction luminance signals in these positions could interact (interfere) with each other.

Meanwhile, since a diffracted image of a certain pixel does not appear in the diagonal direction (oblique direction), pixels positioned in the oblique direction of that pixel are not affected.

Therefore, even when a plurality of white pixels positioned in the oblique direction exist in one reference pattern, the reproduction reference pattern signal 26 having almost no interference can be provided.

FIG. 7 is the example of the reference patterns generated in view of such diffraction phenomenon based on the configuration of the aperture. That is, the luminance information of each pixel of the reference pattern in FIG. 7 is two-dimensionally dispersed so that the reproduction luminance signals of the pixels (detection unit pixels) do not interfere with each other when its reference pattern (two-dimensional pattern) is reproduced.

According to the three reference patterns in FIG. 7, the white pixels are arranged in the horizontal and the vertical directions every two pixels in view of an influence of the diffraction phenomenon.

Meanwhile, the white pixels are adjacently provided in the upward oblique direction.

According to the three reference patterns in FIG. 7, although there are eight or nine white pixels and others are black pixels, all of the 25 pixels can be covered with these three reference patterns. Thus, the luminance correction coefficients which can ignore the respective interferences can be generated for all pixels using these three reference patterns.

Therefore, since the number of the reference patterns is three in FIG. 7, the recording capacity for the reference patterns can be reduced to ⅛ or less as compared with the number of the reference patterns (25) in FIG. 6.

Similarly, even when the number of pixels is as great as ten thousand, the recording capacity required for the reference patterns can be considerably reduced by generating the reference patterns like in FIG. 7.

In addition, since the number of reference patterns is reduced in FIG. 7, a time required to generate the luminance correction coefficients can be shortened as compared with the case in FIG. 6.

In FIG. 7, although the white pixels are arranged upward in the oblique direction, they may be arranged downward in the oblique direction.

FIG. 8(b) shows an example of a diffracted image when an opening configuration of the aperture is a circle (circular aperture).

When the aperture is the circle, concentric diffracted images at intervals are detected centered on the central transmission image. Therefore, since there is no directionality in diffraction phenomenon, it is necessary to select pixels which are apart from at a certain distance from the central pixel in one reference pattern.

Since it is thought that this distance depends on a size of the pixel or a size of the aperture, it cannot be determined uniquely.

FIG. 9 shows examples of reference patterns used in the case of the circular aperture.

A CCD includes 49 pixels in 7×7 matrix in FIG. 9.

According to FIG. 9, white pixels are arranged every 5 pixels in horizontal and vertical directions and every 2 pixels in oblique direction.

In this case, there are five white pixels or three white pixels in one reference pattern. According to the concept shown in FIG. 6, it is necessary to record 49 reference patterns including only one white pixel. Meanwhile, there are only 18 reference patterns in FIG. 9, so that the recording capacity required for the reference patterns can be reduced by 18/49.

<Concrete Example of Distortion Correcting Process>

A concrete example of a correcting process to generate the correction information will be described in detail using the reference pattern.

The correction information is mainly generated by the correction information generation unit 6.

Two patterns (A and B) shown in FIG. 13 are used in this example. The correction information to be generated is a coefficient map provided by comparing a pattern in FIG. 17(a) with a pattern in FIG. 17(b) and a pattern of a low-frequency noise component shown in FIG. 18.

Figure 18:
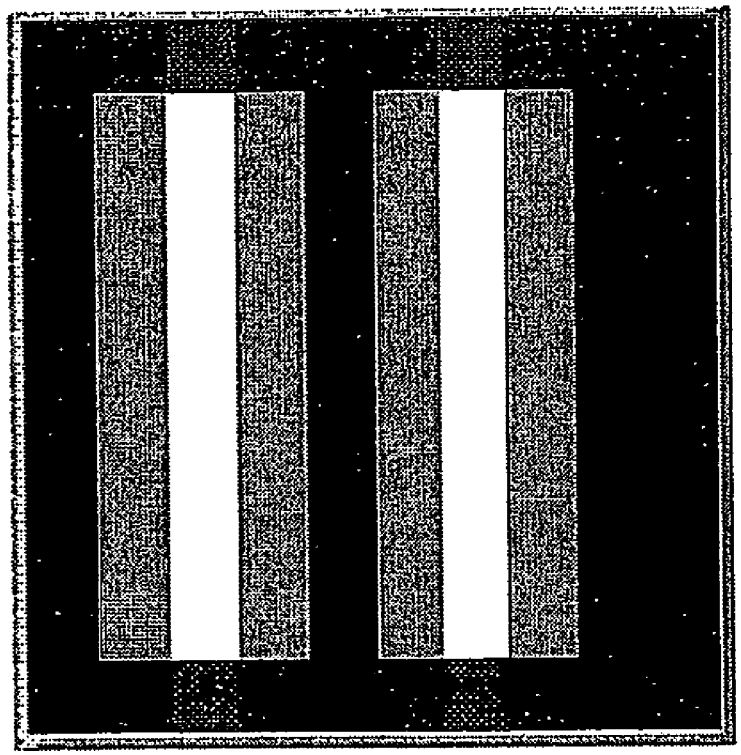
FIG. 18 is an explanatory diagram showing one embodiment of a pattern of a low-frequency noise component according to the present invention.

Although the correction information can be found as a map of the luminance correction coefficients as described above, it may be found as a luminance pattern of pixels as shown in FIG. 18.

Figure 11:
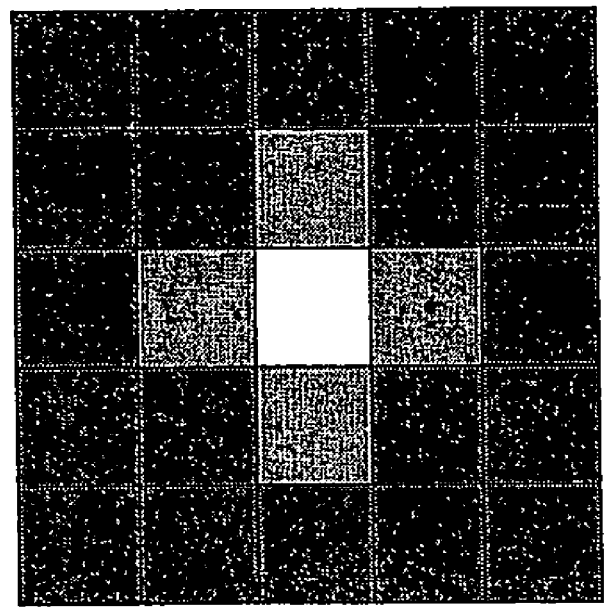
FIG. 11 is an explanatory diagram showing an interference pattern generated in the recording and reproducing apparatus according to one embodiment.

FIG. 11 shows an interference pattern generated in a recording and reproducing apparatus used in this concrete example due to the light diffraction phenomenon.

Figure 12:
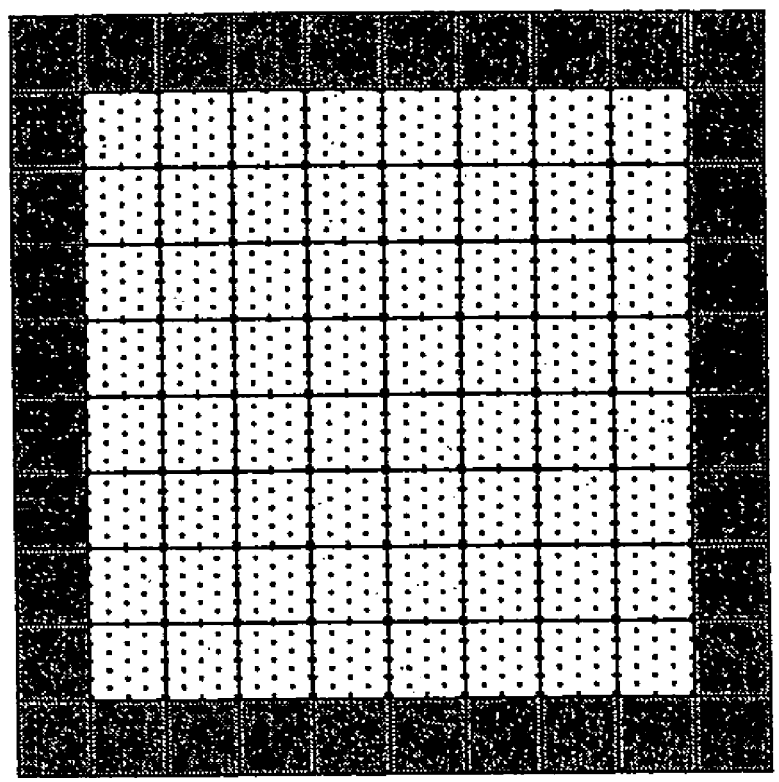
FIG. 12 is an explanatory diagram showing a pixel pattern of a two-dimensional image sensor of the recording and reproducing apparatus according to the present invention.

FIG. 12 shows a pixel pattern (detection range) of the two-dimensional image sensor (CCD) of the recording and reproducing apparatus according to the present invention.

To simplify the description, it is assumed that the central detection unit pixel is a white pixel in the pattern to be reproduced and it interferes with only four adjacent pixels in the reproduction pattern on the CCD due to the diffraction phenomenon of the reproduction light beam as shown in FIG. 11.

Here, it is assumed that the square pattern is used.

In this case, the luminance of four pixels which are directly adjacent to the central white pixel in the horizontal and vertical directions have their luminance levels which are close to that of the white pixel.

It can be found whether the recording and reproducing apparatus has the specific interference pattern shown in FIG. 11 by performing Fraunhofer diffraction calculation.

Although a CCD shown in FIG. 12 includes 100 detection unit pixels in 10×10 matrix, it is assumed that effective pixels to detect the reproduction light beam are 64 pixels (8×8) except for outer peripheral pixels.

However, it is assumed that the reproduction light beams are received by the 100 pixels at the time of reproducing.

FIG. 13 shows two reference patterns used in this concrete example.

According to this concrete example, since the rectangular aperture is used, the reference pattern in which white pixels are arranged in the oblique direction as shown in FIG. 7 is used.

The reference pattern A is a checkered pattern in which an upper left pixel is white in an effective pixel region, and the reference pattern B is a checkered pattern in which an upper right pixel is white in an effective pixel region.

According to this concrete example, only the two reference patterns (A and B) are to be previously recorded on the medium 20.

Figure 10:
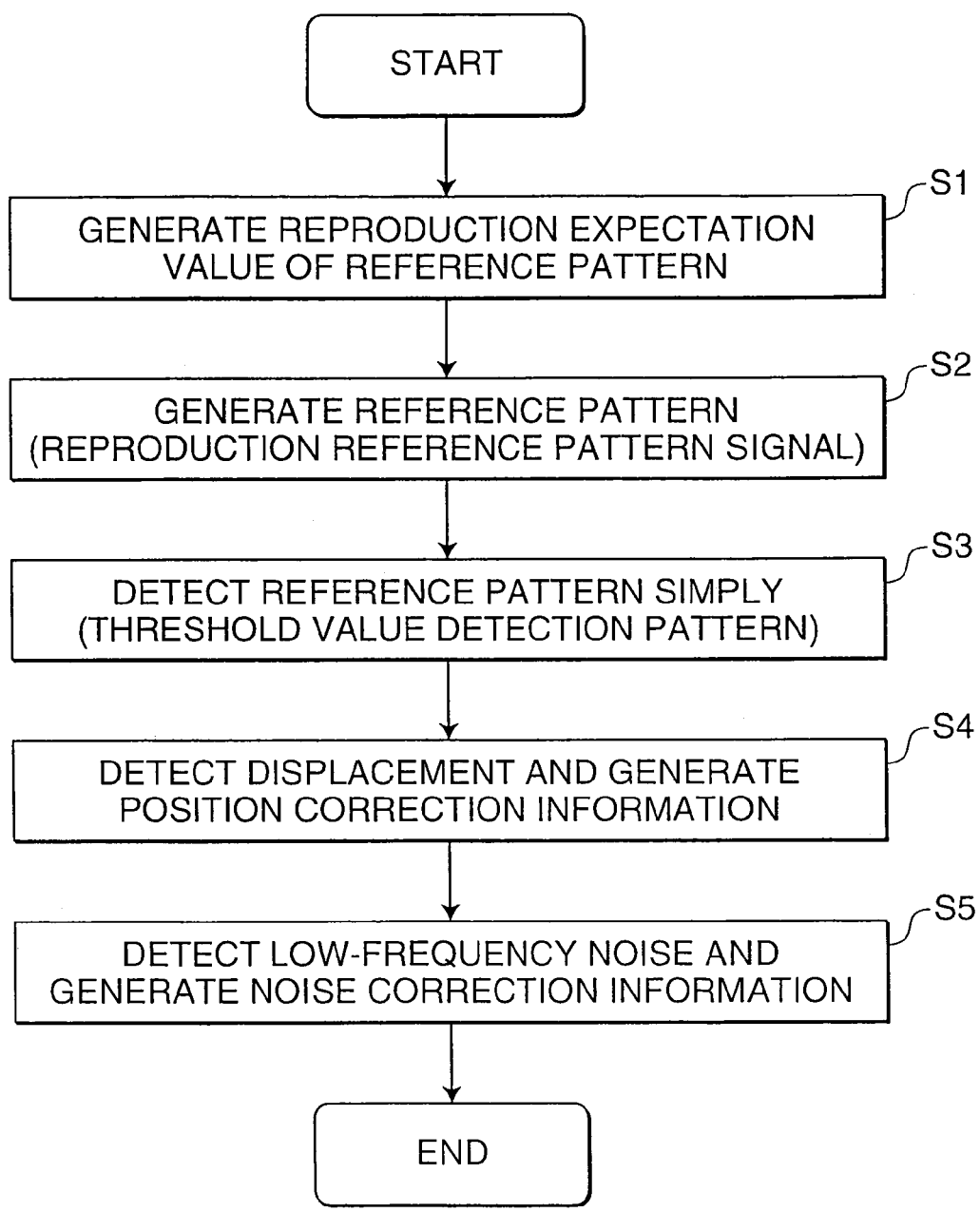
FIG. 10 is a flowchart showing a correcting process for fixed distortion according to the present invention.

FIG. 10 is a schematic flowchart showing the fixed distortion correcting process according to the present invention.

According to this flowchart, the two reference patterns (A and B) on the medium in FIG. 13 are reproduced and a predetermined calculation is performed, whereby the correction information is generated.

[Step S1: Formation of Reproduction Expectation Value]

At step S1, an expectation value (reproduction expectation value) of the reference pattern is formed.

The expectation value of the reference pattern means a luminance distribution of the reproduction reference pattern signal 26 to be detected in the recording and reproducing apparatus when the reference patterns shown in FIG. 13 are reproduced, in view of the reference pattern shown in FIG. 11.

The expectation value is provided by calculating the diffraction pattern in FIG. 11 using computation of convolution every ON pixel of the reference patterns (A and B).

FIG. 14 shows a concrete example of the patterns of the expectation values (reproduction expectation values) of the two reference patterns (A and B).

Here, the patterns in FIG. 14 are different from the patterns shown in FIG. 13 in that luminance tones are displayed and an influence of diffraction is contained.

The data of the reproduction expectation values is temporally stored in a memory such as the RAM.

In addition, this data of the reproduction expectation values is used at step S5.

[Step S2: Reproduction of Reference Pattern]

At step S2, the reference pattern recorded on the medium 20 is reproduced.

This reproducing process is performed like a normal reproducing process on the holographic recording medium.

That is, the recording region of the medium 20 in which the reference pattern (A or B) shown in FIG. 13 are recorded is irradiated with the reference light beam 24, and the reproduction light beam 25 which is its reflected light beam is detected by the CCD.

A signal detected by the CCD is the reproduction reference pattern signal 26 shown in FIG. 1.

FIG. 15 shows a concrete example of patterns corresponding to the reproduction reference pattern signal 26 detected by the CCD.

When the recording and reproducing apparatus has the fixed distortion shown in FIG. 19 or 20, a distortion component is contained in the signal patterns shown in FIG. 15.

[Step 3: Simple Detection of Reference Pattern]

At step S3, the reproduction reference pattern signal 26 provided at the step S2 is converted to binary data by a simple threshold value detecting process and the like.

The simple threshold value detecting process means that each luminance of the pixel is binarized using a predetermined threshold value (slice level) of the luminance.

This process is performed to correct the displacement with high precision at the next step S4.

For example, when a luminance level L of a certain pixel is lower than a threshold value LO (L<L0), it is determined that the pixel is OFF.

In addition, when a luminance level L of a certain pixel is not less than the threshold value LO (L≧0), it is determined that the pixel is ON.

The above simple detecting process is performed for all pixels.

FIG. 16 shows reproduction patterns (threshold detection patterns) after the simple detecting process was performed to the reproduction reference pattern signal 26 shown in FIG. 15.

The data of the reproduction patterns shown in FIG. 16 by the simple detection are used at step S4.

Although the luminance data of the converted reproduction pattern could contain an error detection result due to a noise or an influence of interference among the pixels, since the influence of the noise and the like can be averaged by calculating a cross-correlation value of the luminance data in a certain range (10/10 pixels, for example), the displacement itself of the pixel at the time of reproducing can be detected with high precision.

[Step S4: Detection of Positional Distortion (Displacement)]

At step S4, displacement due to distortion aberration shown in FIG. 19 is detected and position correction information which is one of correction information is generated.

The displacement is detected by comparing the data of the reference patterns in FIG. 13 recorded in the reference pattern storage unit 10 previously with the threshold detection patterns in FIG. 16 formed at the step S3.

FIG. 17 is an explanatory diagram showing the displacement detecting process.

Figure 17A:
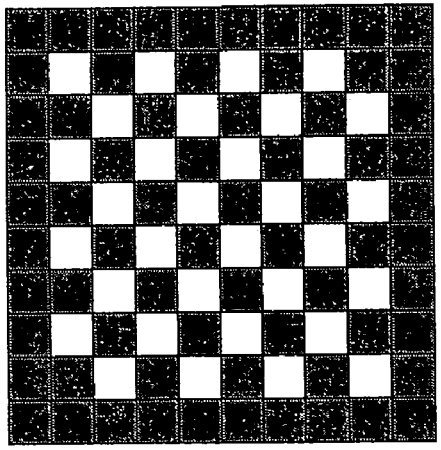
FIGS. 17(a), (b), (c) and (d) are explanatory diagrams showing one embodiment of a displacement detecting process and position corrected data according to the present invention.

FIG. 17(a) shows the same pattern as the reference pattern A shown in FIG. 13.

Figure 17B:
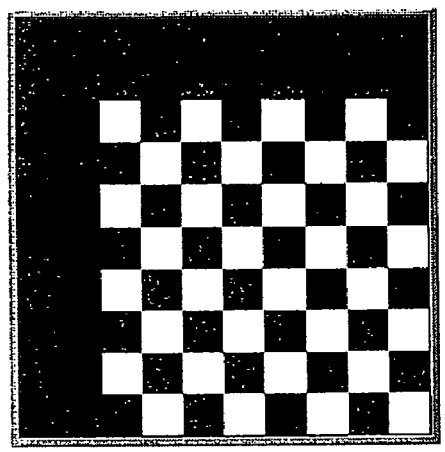

FIG. 17(b) shows the same pattern as the threshold detection pattern A shown in FIG. 16.

Even when luminance data of the two patterns are compared simply every pixel, although the displacement tendency can be found in some cases, it is preferable to use the cross correlation found in the horizontal and vertical direction every pixel.

The cross correlation may be found as follows.

First, the reproduction pattern is moved backward, forward, sideways and crossways by one pixel to form patterns and cross-correlation values between the respective patterns and the reference pattern are found and a maximum value of the cross-correlation values is found. Thus, the pattern from which the maximum cross-correlation value was found shows a shift amount.

Thus, it can be found how much and in which direction the position of the reproduction data is shifted.

For example, since the maximum cross-relation result is provided in the reproduction pattern which is shifted diagonally downward right by one pixel in FIGS. 17(a) and 17(b), it can be found that the position is shifted diagonally downward right by one pixel.

Thus, since the direction and amount of the displacement were found, the position correction information to correct the displacement is generated so that the reproduction data may be reproduced in the same position as the reference patterns shown in FIG. 13. That is, a luminance correction coefficient to correct the position is calculated. The luminance correction coefficient is stored in the storage unit 11 as the correction information.

Figure 17C:
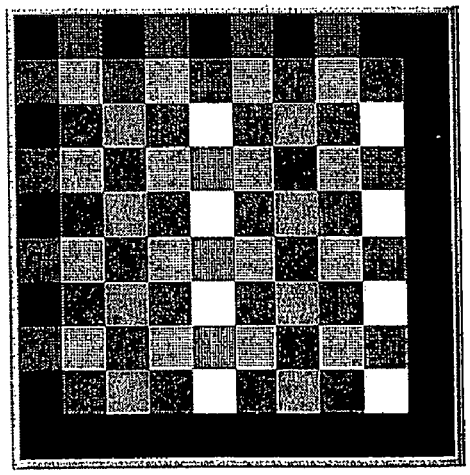
Figure 17D:
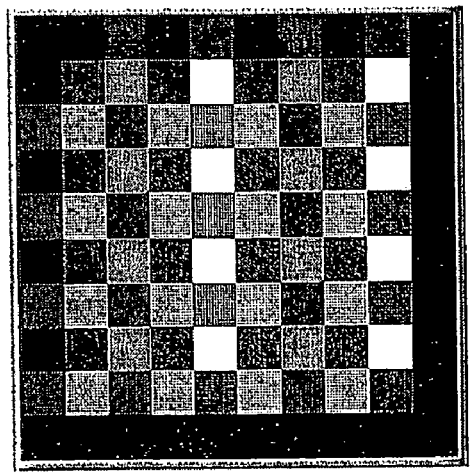

FIGS. 17(c) and 17(d) show corrected reproduction patterns (position corrected data) after the correction information (luminance correction coefficient) found by the above calculation was applied to the reproduction reference pattern signals (A and B) in which the displacement is generated as shown in FIG. 15.

FIG. 17(c) shows the pattern (position corrected data) after the position of the reproduction pattern of the reproduction reference pattern signal A in FIG. 15 is corrected, in which the reproduction pattern (in FIG. 15) is corrected so as to be shifted obliquely downward right by one pixel.

FIG. 17(d) shows the pattern (position corrected data) after the position of the reproduction pattern of the reproduction reference pattern signal B in FIG. 15 is corrected, in which its displacement is corrected similarly.

Since the position corrected data in FIGS. 17(c) and 17(d) are used at the next step S5, it is preferable to generate them at this step S4.

When only the distortion shown in FIG. 19 exists in the recording and reproducing apparatus and there is no low-frequency noise shown in FIG. 20, the operation at step S5 may be omitted and the correction information generating process can be completed at the step S4.

On the contrary, when the displacement is not detected at the step S4, it is not necessary to generate the position corrected data and the operation may proceed to step S5.

At the step S4, the luminance correction coefficient found by the above calculation is stored in the correction information storage unit 11.

[Step S5: Detection of Low-Frequency Noise]

At step S5, luminance variation due to the low-frequency noise shown in FIG. 20 is detected and low-frequency noise correction information which is one of the correction information is generated.

At the step S5, the data of the reproduction expectation value generated at step the S1 shown in FIG. 14 is compared with the position corrected data (in FIGS. 17(c) and 17(d)) to which the position correction information (luminance correction coefficient) generated at the step S4 were applied.

When it is not necessary to perform the position correction, the data of the reproduction reference pattern signal 26 reproduced at the step S2 itself may be used instead of the data shown in FIGS. 17(c) and 17(d).

For example, the luminance value L1 of the pixel of the reproduction expectation value A in FIG. 14 is compared with the luminance value L2 of the pixel at the same position in the position corrected reproduction data shown in FIG. 17(c). More specifically, a difference between the luminance value L1 and the luminance value L2 (L1−L2) is calculated (subtraction) for all pixels.

When there is no low-frequency noise originally, since this difference (L1−L2) is zero, the difference (L1−L2) corresponds to a low-frequency noise component LN.

In other words, the low-frequency noise component (L1−L2) becomes the correction information (low-frequency noise correction information) to remove the low-frequency noise. That is, the luminance value L1 of the pixel of the reproduction data to be expected at the time of reproducing can be provided by adding the noise component LN corresponding to that pixel, to the luminance value L2 of the pixel in the reproduction data (FIG. 17(c)) containing the low-frequency noise (L1=L2+LN).

Therefore, when the user data recorded in the recording medium 20 is reproduced, the reproduction data having a luminance value (corresponding to L1) having no low-frequency noise can be provided by adding the noise component LN corresponding to each pixel, to the luminance value (corresponding to L2) of each pixel of the reproduction data signal 27.

Thus, at the step S5, the low-frequency noise component in which the above subtraction was calculated is stored in the correction information storage unit 11 as the correction information. FIG. 18 shows one embodiment of the pattern of the low-frequency noise component LN.

Although this low-frequency noise component LN is found in a way different from that of the coefficient found at the step S4, since it is the same kind as the parameter to correct the luminance value, it can be regarded as one of the luminance correction coefficients.

In addition, when the mutual interference among the pixels is almost negligible, as the luminance value L1, the luminance information of the reference pattern previously recorded in the reference pattern recording unit 10 may be used.

Furthermore, when it is not necessary to correct the position, as the luminance value L2, the luminance information obtained from the reproduction reference pattern signal 26 may be used.

In this case, the low-frequency noise component LN (correction information) can be found by calculating the difference between the luminance information (L1) of the reference pattern and the luminance information (L2) provided from the reproduction reference pattern signal 26 every detection unit pixel.

Although the step S5 is performed after the step S4 in the flowchart shown in FIG. 10, since the steps S4 and S5 can be independently performed, the order of the steps S4 and S5 is not important, so that the step S5 may be performed before the step S4.

As described above, the correction information to correct the fixed distortion specific to the recording and reproducing apparatus according to the present invention is generated and stored in the correction information storage unit 11.

When the user data recorded on the recording medium 20 is actually reproduced in the recording and reproducing apparatus according to the present invention, the predetermined correction calculation is performed using the correction information stored by the process shown in FIG. 10, so that the corrected reproduction data 28 having no distortion can be provided from the reproduction data signal 27.

For example, when only the low-frequency noise exists as the fixed distortion, the correction calculation to add the luminance information (L2) provided from the reproduction data signal 27 of the reproduction user data, to the luminance correction coefficient (here, the low-frequency noise component LN) recorded in the correction information storage unit 10 may be performed for every pixel.

Thus, the corrected reproduction data 28 of the user data can be generated.

In addition, although the correction calculation is carried out in the distortion correction unit 7 shown in FIG. 1, it is not necessary to provide special hardware, it can be implemented by a software process using the microcomputer. That is, since it is not necessary to provide special hardware for the fixed distortion correcting process, a circuit size of the hardware can be small.

In addition, since it is not necessary to generate the correction information at the time of reproducing, a reproducing time itself can be shortened.

In addition, the distortion correcting process shown in FIG. 10 is to be performed before the user data is reproduced for the first time and at the following timing which is different from the timing to reproduce the user data, that is, (1) just after the recording medium 20 is inserted to the apparatus, (2) when a power is turned on for the first time or when a recording operation is performed for the first time after the apparatus is purchased, (3) just after a predetermined temperature variation is generated in the apparatus, (4) before shipment, (5) every time the number of usage exceeds a predetermined number, or (6) every lapse of a predetermined days.

As described above, according to the present invention, since the reference pattern (two-dimensional pattern) is previously recorded on the recording medium and the correction information of the fixed distortion is generated using the reference pattern and stored, the fixed distortion can be detected before the user data recorded on the medium is actually reproduced.

In addition, the recording capacity for the reference pattern can be reduced by devising the reference pattern to be recorded on the medium.

Furthermore, since the correction information for the fixed distortion has been already generated before the user data is reproduced, and only the correcting process using the correction information is performed by the software with the microcomputer at the time reproducing, the reproducing process of the user data can be performed in a short time.

In addition, since the function of the correction information generation unit 6 and the distortion correction unit 7 can be implemented by the software process with the microcomputer, the circuit size of the hardware can be kept small.

According to the present invention, the correction information which can remove the fixed distortion specific to the recording and reproducing apparatus can be easily generated by using the two-dimensional pattern recorded on the medium previously.

In addition, the correction information is generated before the user data is not reproduced, a time for the reproducing process of the user data itself can be shortened.

Furthermore, since the two-dimensional pattern recorded on the medium previously includes luminance information arranged so that the plurality of detection unit pixels do not interfere with each other, the storage capacity of the two-dimensional patterns can be saved and the recording capacity for the user data can be sufficiently ensured.

What is claimed is:

1. A recording and reproducing apparatus having a fixed distortion correcting function, comprising:

a reproduction signal detection unit reproducing either a two-dimensional pattern previously recorded on a holographic recording medium or user data recorded on the holographic recording medium;

a reference pattern storage unit previously storing a reference pattern to be provided when the two-dimensional pattern is reproduced;

a correction information generation unit comparing a reproduction reference pattern signal corresponding to the two-dimensional pattern reproduced by the reproduction signal detection unit with the reference pattern stored in the reference pattern storage unit, and removing fixed distortion contained in the reproduction reference pattern signal to generate correction information used for reproducing the reference pattern from the reproduction reference pattern signal;

a correction information storage unit storing the generated correction information; and a distortion correction unit performing a correction calculation, for a reproduction data signal of the user data reproduced by the reproduction signal detection unit, using the stored correction information to generate corrected reproduction data from which the fixed distortion contained in the user data is removed.

2. The recording and reproducing apparatus according to claim 1, wherein the reference pattern includes luminance information in case the two-dimensional pattern is reproduced without any fixed distortion, the two-dimensional pattern previously stored on the holographic recording medium includes luminance information based on every detection unit pixel detected by the reproduction signal detection unit, and the luminance information is dispersed two-dimensionally so that a plurality of reproduction luminance signals of the detection unit pixels may not interfere with each other when the two-dimensional pattern is reproduced.

3. The recording and reproducing apparatus according to claim 2, wherein the correction information generation unit calculates a difference between the luminance information of the reference pattern and the luminance information provided from the reproduction reference pattern signal of the two-dimensional pattern reproduced by the reproduction signal detection unit, every detection unit pixel, and a luminance correction coefficient provided as a result of the calculation is stored in the correction information storage unit as the correction information of the fixed distortion.

4. The recording and reproducing apparatus according to claim 3, wherein the distortion correction unit performs a correction calculation to add the luminance information provided from the reproduction data signal of the user data reproduced by the reproduction signal detection unit, to the luminance correction coefficient recorded in the correction information storage unit, every detection unit pixel, and corrected reproduction data for the user data is generated.

5. The recording and reproducing apparatus according to claim 1, wherein the correction information is a luminance correction coefficient to correct the fixed distortion specific to the recording and reproducing apparatus, and the fixed distortion includes distortion due to distortion aberration in which a position of a detection unit pixel detected by the reproduction signal detection unit is varied, and distortion due to a low-frequency noise in which a different luminance value is generated every detection unit pixel at the time of reproducing.

6. The recording and reproducing apparatus according to claim 1, wherein reproduction of the two-dimensional pattern by the reproduction signal detection unit and generation of the correction information by the correction information generation unit are performed at predetermined timing when reproduction of the user data by the reproduction signal detection unit is not performed, and the predetermined timing includes one or more timings among (i) just after the holographic recording medium is inserted, (ii) just after a predetermine temperature variation is generated in the recording and reproducing apparatus, (iii) after a lapse of predetermined days, and (iv) before shipment.

* * * * *